United States Patent [19]
Lin et al.

[11] Patent Number: 5,851,881
[45] Date of Patent: Dec. 22, 1998

[54] METHOD OF MAKING MONOS FLASH MEMORY FOR MULTI-LEVEL LOGIC

[75] Inventors: Ruei-Ling Lin, Kaohsiung; Ching-Hsiang Hsu; Mong-Song Liang, both of Hsin-chu, all of Taiwan

[73] Assignee: Taiwan Semiconductor Manufacturing Company, Ltd., Hsin-Chu, Taiwan

[21] Appl. No.: 944,500

[22] Filed: Oct. 6, 1997

[51] Int. Cl.$^6$ ............................................. H01L 21/8247
[52] U.S. Cl. ........................ 438/261; 438/266; 438/296
[58] Field of Search ................................. 438/216, 261, 438/264, 266, 267, 287, 296

[56] References Cited

U.S. PATENT DOCUMENTS

| | | | |
|---|---|---|---|
| 5,173,436 | 12/1992 | Gill et al. | 438/296 |
| 5,293,560 | 3/1994 | Harari | 365/185 |
| 5,387,534 | 2/1995 | Prall | 438/296 |
| 5,480,821 | 1/1996 | Chang | 437/43 |
| 5,496,753 | 3/1996 | Sakurai et al. | 437/43 |
| 5,515,321 | 5/1996 | Hazama | 365/185.19 |
| 5,559,048 | 9/1996 | Inoue | 438/261 |

OTHER PUBLICATIONS

"A 1–Mb EEPROM With a Monos Memory Cell For a Semi–conductor Disk Application" IEEE Journal of Solid State Circuits, vol. 26, No. 4, Apr. 1991, p. 498.

*Primary Examiner*—Chandra Chaudhari
*Attorney, Agent, or Firm*—George O. Saile; Stephen B. Ackerman

[57] ABSTRACT

The present invention provides a structure and method of manufacturing split gate MONOS multi-level logic memory device. The memory device has a poly stacked gate transistor 20A in series with a MONOS transistor 24A. The device has a novel operation to achieve multi-level memory storage (e.g., 4 voltage states). The method begins by forming a tunnel oxide layer 30 on the surface of a semiconductor substrate 10. The substrate having a stacked gate channel area 20 and a MONOS channel area 24 in the active regions. A poly floating gate electrode 32 is formed over the stacked gate channel region 20. A ONO layer having a memory nitride layer is formed over the floating gate 32 and the tunnel oxide layer over the MONOS channel region 24. A control gate electrode 44 is formed over the ONO layer 41 spanning across the poly floating gate electrode 32 and the MONOS channel region 24. Source/drain regions 50 51 are formed in the substrate. A poly flash transistor 20A and a MONOS flash transistor 24A combine to form the 4 level logic memory cell of the invention.

11 Claims, 10 Drawing Sheets

METHOD OF MAKING MONOS FLASH MEMORY FOR MULTI-LEVEL LOGIC

BACKGROUND OF INVENTION

1) Field of the Invention

This invention relates generally to the fabrication of flash memory devices and in particular to an electrically erasable programmable read only memory (EEPROM) array that is based on a MONOS split gate cell (a stacked gate transistor and a MONOS transistor).

2) Description of the Prior Art

A semiconductor nonvolatile storage element in which data is electrically rewritable is called as an EEPROM. The EEPROM has many types and comprise typically a MONOS memory and a MNOS memory and a floating gate.

The MONOS memory is a semiconductor nonvolatile storage element having the structure of Metal-Oxide Nitride-Oxide Semiconductor in a cross section whole the MNOS memory is a semiconductor nonvolatile storage element having the structure of Metal-Nitride-Oxide-Semiconductor in cross section.

The MONOS memory has lately attracted considerable attention because it has a high reliability and data is rewritable therein many times. However, MONOS technology has not been successfully integrated into multi-level memory devices.

U.S. Pat. No. 5,293,560 (Harari) shows a multi-state flash EEPROM system using incremental programming and erasing methods. U.S. Pat. No. 5,515,321 (Hazama) shows a method of reading data in a memory capable of storing three or multi-valued data in one memory cell. U.S. Pat. No. 5,496,753 (Sakarai) shows a storage device having a MONOS structure. U.S. Pat. No. 5,480,821 (Chang) shows a method of fabricating a split-gate flash EEROM array. Also, an IEEE article titled "*A 1-Mb EEPROM With A MONOS Memory Cell For A Semiconductor Disk Application*", IEEE Journal of Solid State circuits, Vol. 26, No 4, April (1991) p. 498. describes a MONOS memory cell and operation.

SUMMARY OF THE INVENTION

An object of this invention is a multi-level storage cell which increases the density of flash memory devices.

It is an object of the present invention to provide a method for fabricating higher density flash memory cell with a multi-level storage function in a single bit.

It is an object of the present invention to provide a method for fabricating a flash memory cell with a split gate comprised of a floating stacked gate transistor in series with a MONOS transistor.

It is an object of the present invention to provide a method for fabricating a flash memory with a new operation (Fn/Fn) to perform multi-level storage (Vt).

In accordance with this invention, the features are provided as follows:

1) The device is a MONOS flash memory cell for multi-level logic (e.g. 4 logic states ($V_{t0}$ to $V_{t4}$).

2) The device provides a MONOS transistor 24A in series with a stacked polysilicon gate flash transistor 20A for multi-level memory storage. See FIG. 3.

3) The device has a new operation using Fowler-Nordheim in both the MONOS transistor and the stacked gate (FN/FN) to achieve multi-level memory storage.

4) The device has a split-gate structure used for a single bit multi-level storage Flash Memory cell.

5) The device allows a higher density flash memory using the same process technology.

6) Four levels of logic are produced by varying the charge of the stacked gate 32 and the MONOS gate 41.

7) The memory device is erased by charging the control gate and without using a separate erase gate.

In accordance with this invention, the method of manufacture of a semiconductor multi-level memory device comprises the steps as follows:

a) See FIGS. 1A and 1B—forming a tunnel oxide layer 30 on a surface of a substrate 10; the substrate having a floating gate channel area 20, a MONOS channel area 24, and a source area 78 adjacent the floating gate channel area 20 and a drain area 79 adjacent the MONOS channel area 24;

b) See FIG. 1B—forming a first polysilicon layer 32 over the floating gate channel area and the source area 78;

c) forming an ONO layer 41 over the top of the first polysilicon layer 32 and covering the sidewalls thereof and the exposed surfaces of the tunnel oxide layer 30;

d) FIG. 1B—forming a second polysilicon layer 44 over the second oxide layer 40;

e) forming a pad oxide layer over the second polysilicon layer 44;

f) forming a second nitride layer 42 over the pad oxide layer 44;

g) FIG. 1B—removing the second nitride layer 42, the pad oxide layer, the second polysilicon layer 44, the ONO layer 41 from over the source area 78 and the drain area 79; the remaining portion of the second polysilicon layer forming a control gate electrode 44 spanning across the floating gate electrode 32 and the NOMOS channel area 24;

h) FIGS. 1C and 1D—removing the tunnel oxide layer 30 and the first polysilicon layer 32 from over the source area 79 forming a dual gate stack 49;

i) FIG. 1G—forming shallow trench isolation regions 70 in portions of the source and drain area 78 79 in the substrate 10;

j) FIG. 1G—removing the second nitride layer 42 and the pad oxide layer;

k) FIG. 1I—forming a source region 52 in the source area 78 in the substrate adjacent to the stacked gate channel area 20 and under a portion of the floating gate electrode 32; and forming a drain region 51 53 in the drain area 79 in the substrate adjacent to the MONOS channel area 24 and under a portion of the ONO layer 41; the source and drain regions orientated in a first direction; See FIG. 2A.

l) FIGS. 1J & 1K—forming an insulating layer 60 over the control gate electrode over the MONOS channel area 24;

m) FIG. 1L—forming word lines 64 68 over the control gate electrode 44 and the insulating layer 60; the word lines oriented in a second direction perpendicular to the source and drain regions 50 51 52 53;

n) the control gate electrode 44 and the floating gate electrode 32 forming a floating gate transistor 20A over the floating gate channel area 20; and the ONO layer 41 and the control gate over the MONOS channel area 24 forming a MONOS transistor 24A over the MONOS channel area 24; the MONOS transistor 24A and the floating gate transistor 20A combining to form a multi-level memory device.

Another aspect of the present invention provides a memory cell structure for a split gate structure with comprising:

a) See FIG. 1L—a substrate 10 having a floating gate channel area 20, a MONOS channel area 24, and a source area 78 adjacent the floating gate channel area 20 and a drain area 78 adjacent the MONOS channel area 24;

b) a tunnel oxide layer 30 over the floating gate channel area 20, the MONOS channel area 24 of the substrate 10;

c) a floating gate electrode 32 over the floating gate channel area 20;

d) an ONO layer 41 over the floating gate electrode 32 and the tunnel oxide layer 30 over the MONOS channel area 24;

e) a control gate electrode 44 over the ONO layer over the floating gate electrode 32 and the MONOS channel area 24;

f) shallow trench isolation regions 70 in portions of the source and drain area 78 79 in the substrate 10;

g) a source region 52 in the source area 79 in the substrate adjacent to the stacked gate channel area 20 and under a portion of the floating gate electrode 32;

h) a drain region 50 51 in the drain area 78 in the substrate adjacent to the MONOS channel area 24 and under a portion of the ONO layer 41; the source and drain regions 50 51 52 53 orientated in a first direction;

i) an insulating layer 60 over the control gate electrode over the MONOS channel area 24;

j) a word line 64 68 over the control gate electrode 44 and the insulating layer 60; the word line oriented in a second direction perpendicular to the source and drain regions 50 51 52 53;

k) the control gate electrode 44 and the floating gate electrode 32 forming a floating gate transistor over the floating gate channel area 20; and the ONO layer and the control gate over the MONOS channel area 24 forming a MONOS transistor over the MONOS channel area 24; and the floating gate transistor 20A comprising a multi-level memory device.

The preferred erase and read voltages employed for memory operation of the device are as follows:

|  | program Floating Gate | program MONOS | Erase | Read |
|---|---|---|---|---|
| Vg | −4 V to −6 V | −4 V to −6 V | 15 to 20 V | 3 to 5 V |
| VD | Floating | 4 V to 6 V | 0 V | 1 to 2 V |
| VS | 8 to 10 V | Floating | 0 V | 0 V | whereby operation of the device is controlled.

The program, erase and read voltages employed for memory operation of the device are as follows: (See FIG. 5b.)

| Vt | Logic States | Q1 | Q2 |
|---|---|---|---|
| Vt0 | erased | charged | charged |
| VT1 | 01 | charged | No Charge |
| Vt2 | 10 | No Charge | Charge |
| Vt3 | 11 | NO Charge | No Charge | where Q1 is the charge on the NOMOS gate 41 and the Q2 is the charge on the poly floating stacked gate 32 whereby operation of the device is controlled. Note that Vt1 and Vt2 can be exchanged, i.e., alternately VT1 (Q1 no charge, Q2 Charged) vt2 (Q1 charged, Q2 no charge).

The invention provides a structure and a method for producing a New flash memory device having a MONOS transistor in series with a stacked gate flash transistor for a multi-level storage device.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a split-gate structure used for a single bit multi-level storage Flash Memory cell.

Process Description

The invention forms a dual gate transistor (MONOS flash memory for multi-level logic) having a floating gate and a NONMOS gate transistor shown in FIGS. 1L, 2A, 2B and 3. The process to fabricate the dual gate is described first. Next, the device structure, electrical characteristics and multi-level logic operation are described.

FIGS. 1A through 1L, 2A, and 2B shows the steps to fabricate the MONOS flash cell of the invention.

Figure 1A:
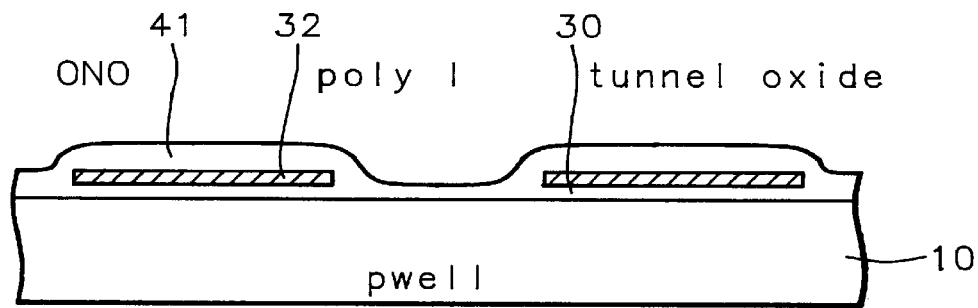
FIGS. 1A through 1L are cross sectional views for illustrating a method for manufacturing the memory device according to the present invention.
Figure 1B:
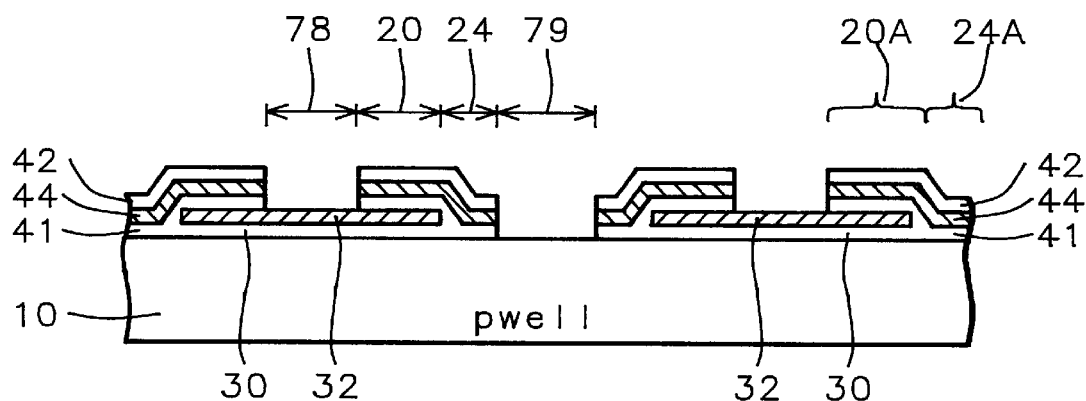
Figure 1C:
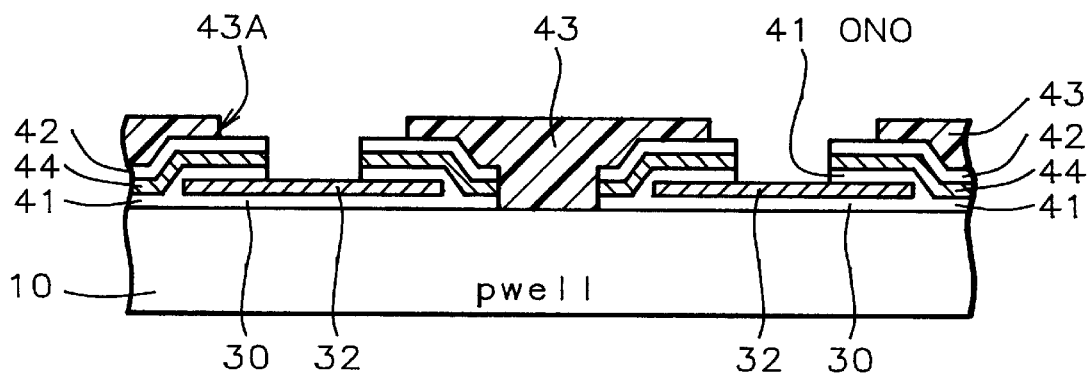
Figure 1D:
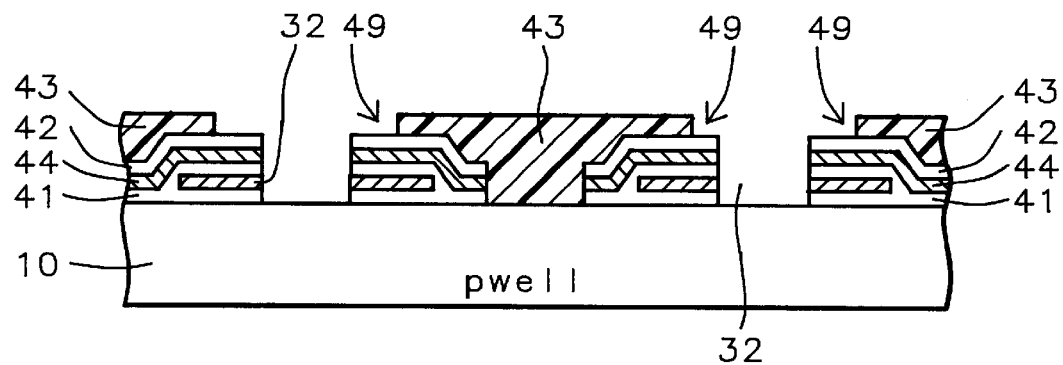
Figure 1E:
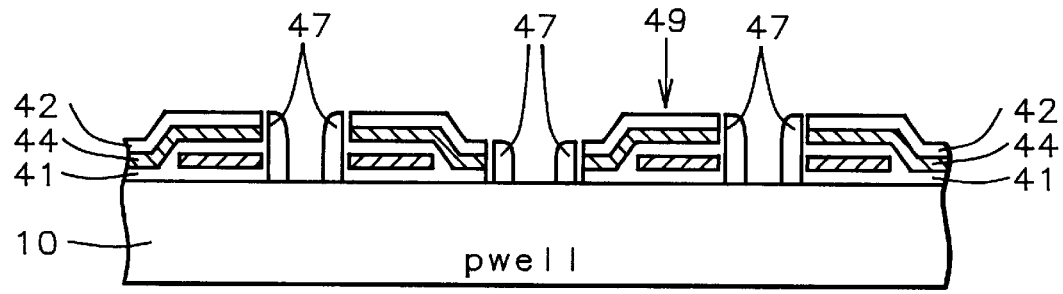
Figure 1F:
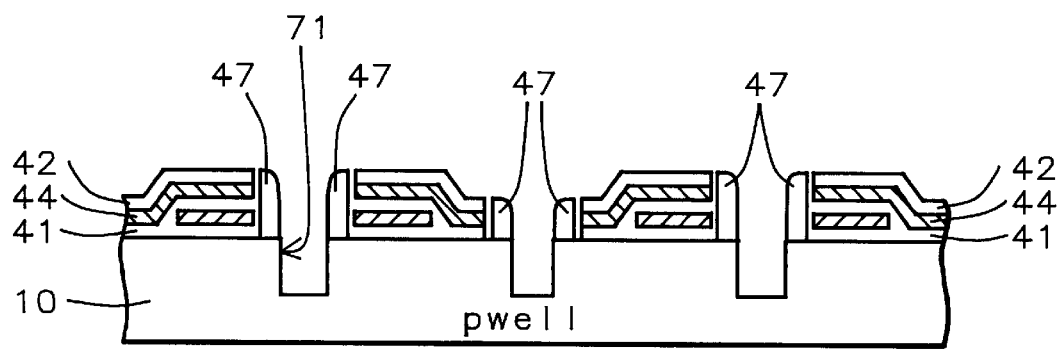
Figure 1G:
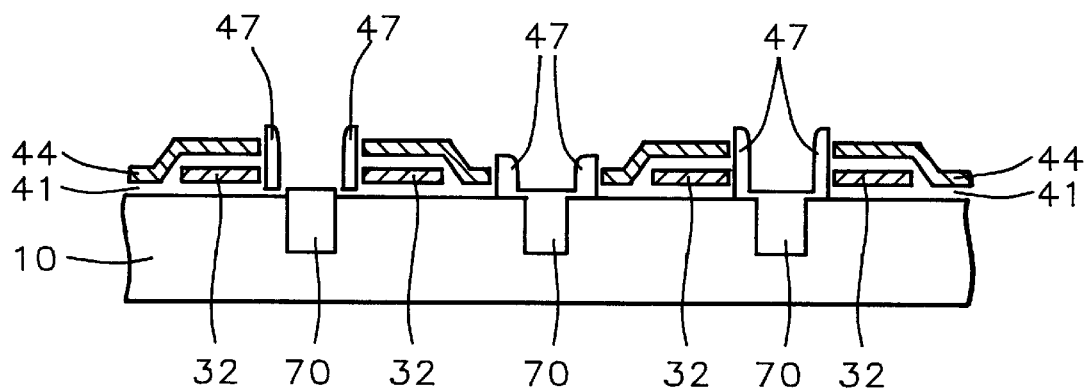
Figure 1H:
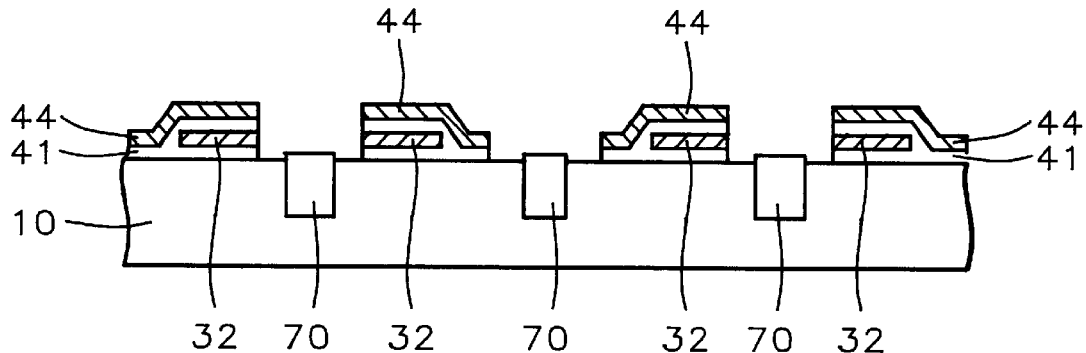
Figure 1I:
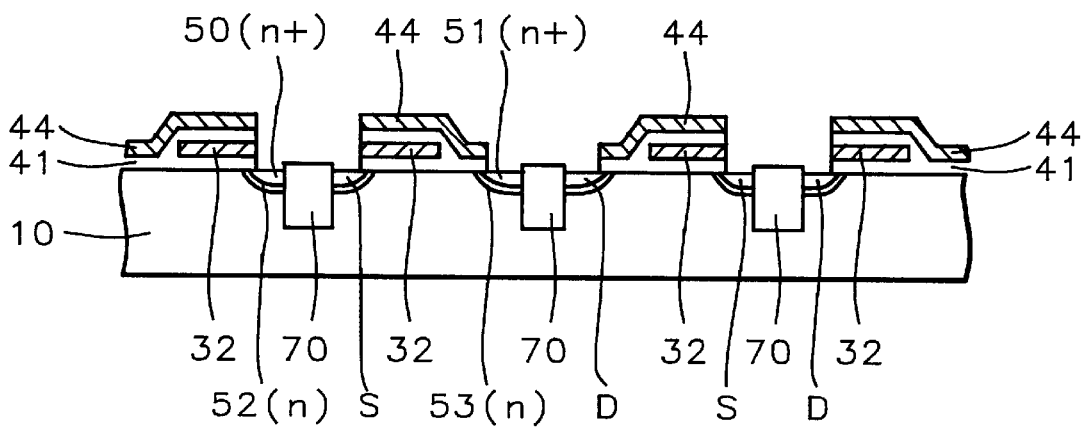
Figure 1J:
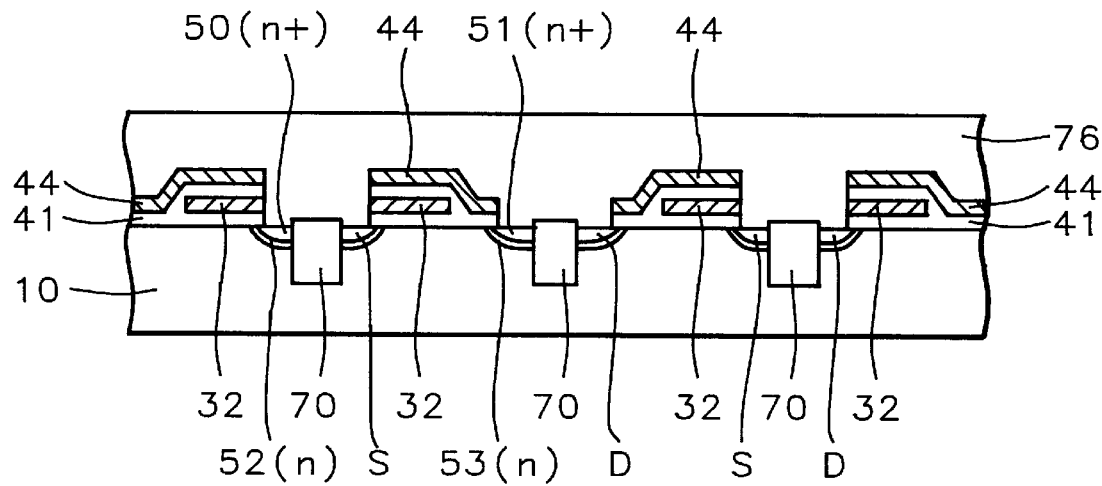
Figure 1K:
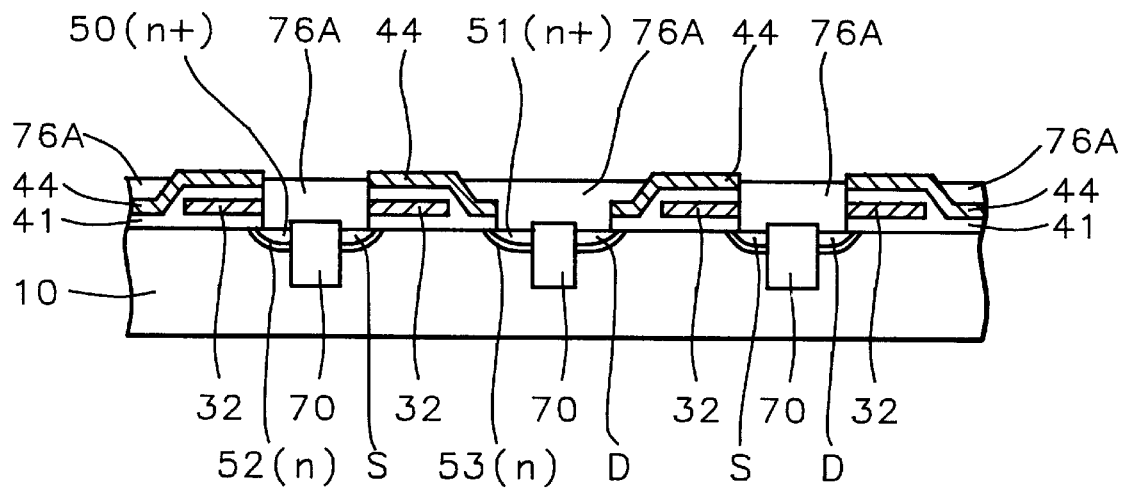
Figure 1L:
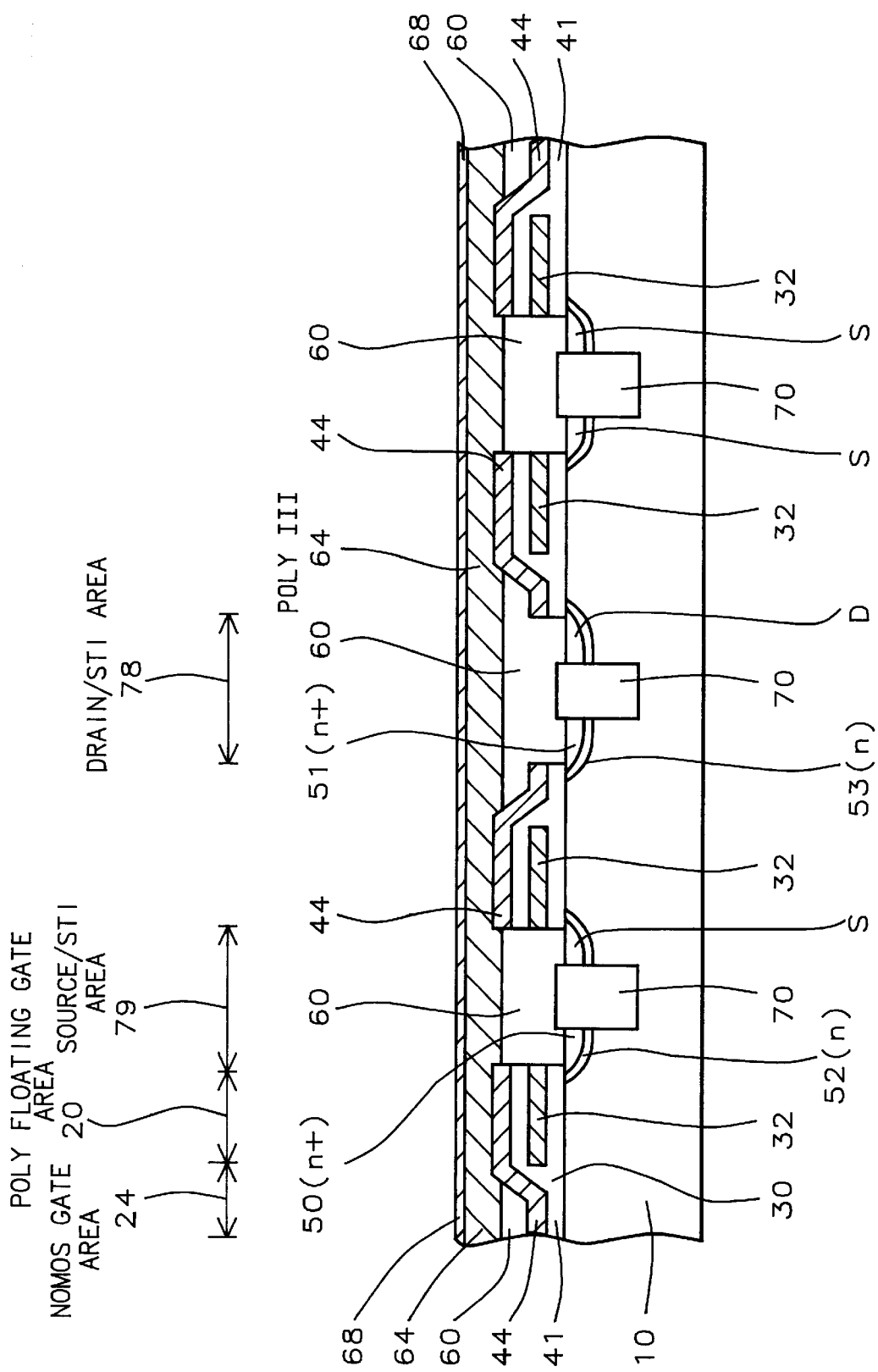

As shown in FIGS. 1A and 1L, a substrate is provided having NOMOS gate channel areas 24, adjacent polysilicon floating gate channel areas 20, a Source/trench (STI) area 79 and drain/shallow trench isolation (STI) area 78 between the NOMOS gate areas 24, and adjacent poly floating gate areas 20. A poly floating gate transistor 20A will be formed over the floating gate channel areas 20 and a MONOS transistor 24A will be formed over the NOMOS gate channel areas 24. See FIG. 3.

Referring to FIG. 1A, a tunnel oxide layer 30 is formed on the surface of a semiconductor substrate 10. The substrate has defined on its surface a stacked Floating gate (FG) gate channel area 20 over which a poly stacked gate transistor (20A) 32 41 44 will be formed and a MONOS channel area 24 over which a MONOS transistor (24A) 41 44 will be formed in the active regions.

The tunnel oxide layer 30 preferably has a thickness in a range of between about 80 and 100 Å (which is exaggerated in thickness for convenience of illustration).

Next, a doped first polysilicon layer (poly I) is formed over the tunnel oxide layer 30. The doped first polysilicon layer preferably has a thickness in a range of between about 2000 and 4000 Å. The poly I layer is preferably deposited using an in-situ doped phosphorous process and preferably has a doping concentration of about 3E20 ions/cc.

A floating gate mask (not shown, e.g., a resist mask) is formed over the first polysilicon layer. The first polysilicon layer is patterned by etching through the mask producing a first polysilicon layer (e.g., a double width floating gate electrode) 32 over the stacked gate channel area 20 and sour/STI area 78. The first polysilicon layer 32 is patterned so that it will form the floating gates of two adjacent transistors 20A. The gate electrode 32 extends over the floating gate area 20, the MONOS gate area 24 and the source/shallow trench isolation (STI) area 78 (not over the drain/shallow trench isolation (STI) area 79).

Still referring to FIG. 1A, an ONO (oxide/nitride/oxide) layer 41 is formed over the substrate and the floating gate electrode 32. The ONO layer 41 is preferably composed the first oxide layer 34, a first nitride layer 36 and a second oxide layer 40. See FIG. 5A. The ONON layer 41 over MONOS area 24 forms the floating gate for the MONOS TX 24A.

To form the ONO Layer 41, a first high temperature oxide layer 34 is formed over the top of the floating gate electrodes 32 and covers the sidewalls thereof and the exposed surfaces of the tunnel oxide layer. The first oxide layer 34 preferably has a thickness in a range of between about 60 and 100 Å.

A first nitride layer 36 (e.g., memory nitride layer 36) is formed over the first oxide layer 34. The first nitride layer 36 is a memory nitride with the ability to store a charge. The first nitride layer 36 preferably has a thickness in a range of between about 60 and 100 Å.

To complete the ONO layer, a second oxide layer 40 is formed over the first nitride layer 36. The second oxide layer is preferably formed by a thermal oxidation process. The second oxide layer 40 preferably has a thickness in a range of between about 60 and 100 Å.

The combination of the first oxide layer 34, the first nitride layer 36 and the second oxide layer 40 comprises an ONO layer (41) 34 36 40. The ONO layer 34 36 40 preferably has an overall thickness in a range of between about 180 and 250 Å.

As shown in FIG. 1B, a second polysilicon layer (poly II) 44 is formed over the second oxide layer 40. The second polysilicon layer 44 preferably has a thickness in a range of between about 6500 and 7500 Å (tgt 7000 Å). The second polysilicon layer 44 preferably has a n-type dopant concentration in a range of between about 5E19 and 5E20 atoms/$cm^3$.

Next, preferably a silicide layer (shown as part of layer 44) is formed over the polysilicon layer 44 over the stacked gate channel area 20 and the MONOS channel area 24. The preferred silicide is composed of TiSi2 or WSix and preferably has a thickness in a range of between about 100 and 200 Å.

Subsequently, a pad oxide layer is grown over the poly II layer. The pad oxide layer preferably has a thickness in a range of between about 450 and 550 Å (shown in figures as combined layer 42).

Still referring to FIG. 1B, a second nitride layer 42 is deposited having a thickness in a range of between about 100 and 300 Å.

Still referring to FIG. 1B, the second nitride layer 42, the second polysilicon (poly II) layer 44 and the ONO layer 41 are patterned forming a (poly) control gate over the (poly) floating gate area 20 and the MONOS gate area 24. These layers are patterning using conventional photolithographic processes (not shown).

FIG. 1C shows forming a first Photoresist layer 43 having a first opening 43A over over at least the source/shallow trench isolation (STI) area 78 to pattern the first polysilicon layer (poly I) layer.

As shown in FIG. 1D, the ONO layer 41 and the first polysilicon layer (poly I) layer 32 are then etched using the first photoresist layer 43 as a mask forming floating gate electrodes 32 and defining a dual gate stack 49. The dual gate stack has sidewalls. The dual gate stack 49 is comprised of 2 transistors: a poly Floating gate transistor 20A over the poly gate area 20 and a MONOS transistor 24A over the MONOS area 24.

Referring to FIG. 1E, the first photoresist layer 43 is removed.

Next, spacers 47 are formed. A low temperature oxide layer is deposited over the resulting surface. The oxide layer preferably has a thickness in a range of between about 1 and 3 $\mu$m. The oxide layer is then etched back to form spacers 47 on the sidewalls of the dual gate stack 49.

As shown in FIG. 1F, the substrate is etched using the spacers 47 as a etch mask forming a trench 71 (e.g., shallow trench isolation (STI) trench 71) preferably has a depth in a range of between about 1 to 3 $\mu$m.

A pad oxide is grown over the substrate. The pad oxide layer preferably has a thickness in a range of between about 300 to 500 Å.

A blanket nitride layer is deposited over the substrate, over the second polysilicon (poly II) layer and filling the trench 71. The blanket nitride layer preferably has a thickness in a range of between about 2 and 3 $\mu$m.

FIG. 1G shows etching back the blanket nitride layer forming an isolation layer 70 filling the trench 71. The etch also preferably removes the blanket nitride layer, the pad oxide remaining over the second polysilicon (poly II) layer 44 and the second nitride layer 42.

As depicted in FIG. 1H, the spacers 47 are then removed.

Figure 2A:
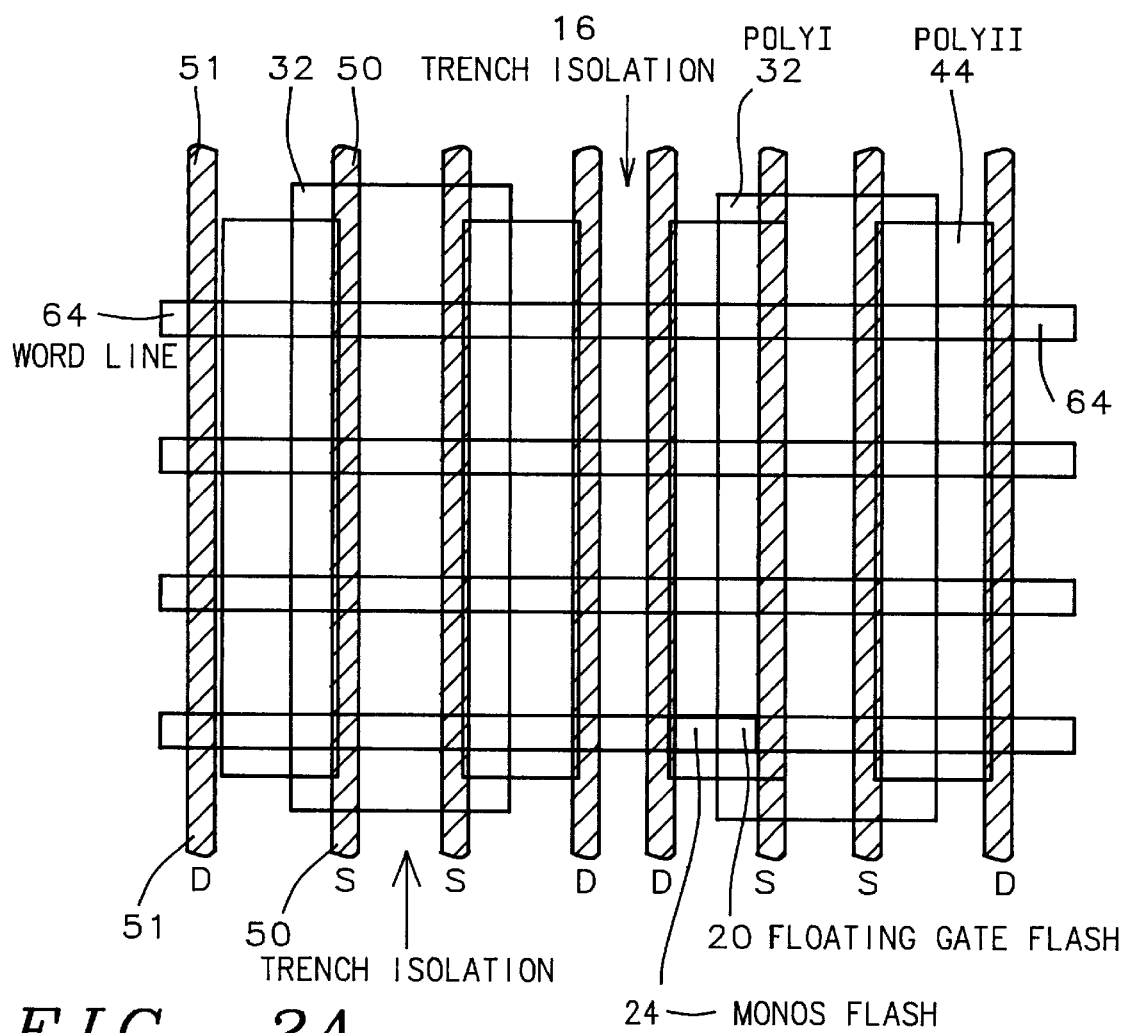
FIG. 2A shows a top plan view of the multi-level memory cell of the present invention.

As shown in FIGS. 1I and 2A, source and drain regions 50 51 52 53 are formed adjacent to the dual gate stack 49.

FIGS. 1I and 2a show forming lightly doped n-source and drain regions 51 53 adjacent to the dual gate stack 49. Lightly doped source/drain regions are formed in the substrate self aligned with the control gate electrode 44 and underlying a portion of the stacked gate channel 20 (e.g., the floating gate 32). A tilted ion implant (I/I) at in angle between about 30° to 45° is preferably used to get the doped region under the channel areas 20 24. Also, thermal treatments help diffuse the ions further under the channel areas 20 24. The lightly doped n-source and drain regions 51 53 are preferably formed using a n-implant with P ions and a dose in a range of between about 5E13 and 5E14 atoms/cm2 and a power in a range of between about 30 and 50 Kev.

Source/drain regions 50 52 are then formed in the substrate self aligned with the control gate electrode 44. The (highly doped) source/drain regions 50 51 are formed by ion implanting with a N-dopant ions self-aligned with the gate electrode stack and the spacers performed at an energy level between about 25 KeV and about 40 KeV with a dose between about 1E15 ions/$cm^2$ and about 5E15 ions/$cm^2$. As shown in top plan view FIG. 2a, the source and drain regions 50 51 extend in a first direction along the surface of the substrate.

FIG. 1J shows depositing an insulating (CVD oxide) layer 76 preferably has a thickness in a range of between about 3 and 5 µm.

In FIG. 1K, the insulating layer 76 is etched back to expose the second polysilicon (poly II) layer and leaving a remaining insulating layer 76a over the source/drain/STI area.

FIG. 1L shows depositing a third polysilicon (poly III) layer having thickness in a range of between about 2500 and 3500 Å. The third polysilicon (poly III) layer is preferably doped using a n+ implant using arsenic at a dose of between 4E15 and 6E15 atom/cm2 and a power between 45 to 55 Kev.

FIG. 1L shows forming a (e.g., $TiSi_2$) silicide layer 68 over the third polysilicon layer 64.

Figure 2B:
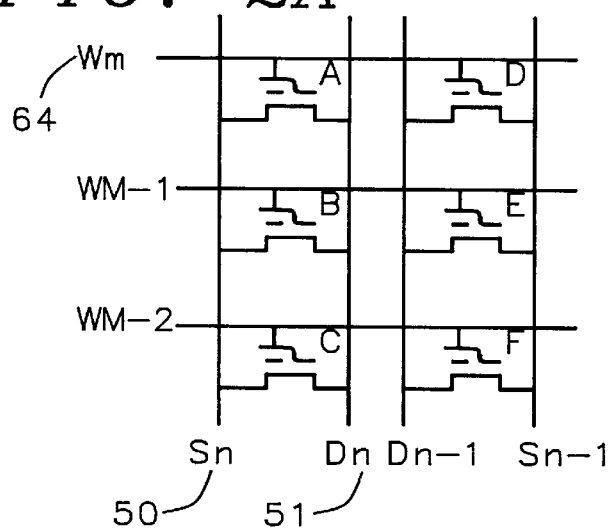
FIG. 2B shows an electrical representation of the memory device of the present invention.

As shown in FIGS. 1L, 2A and 2B the Third polysilicon (poly III) layer 64 is patterned to form wordline perpendicular to the source and drain regions.

The dual stacked gate 49 is etched to remove the Second polysilicon (poly II) layer, ONO and poly I layers where not desired.

Next, a p-field implant is performed to isolate adjacent cells. The p-field implant is preferably performed using boron with a dose between 3E13 and 5E14 ions/cm2 and a power between 40 to 60 Kev.

Finally a set of back end of line (BEOL) steps follow including formation of USG/BPTEOS glass layers, planarization of the glass layers, contact photolithography, contact etching, N+ contact photolithography, N+ contact I/I, blanket P+ Contact I/I, first metallization (ALCU/TiN) deposition, first metallization photolithography, first metallization etching and formation of an alloy.

Figure 3:
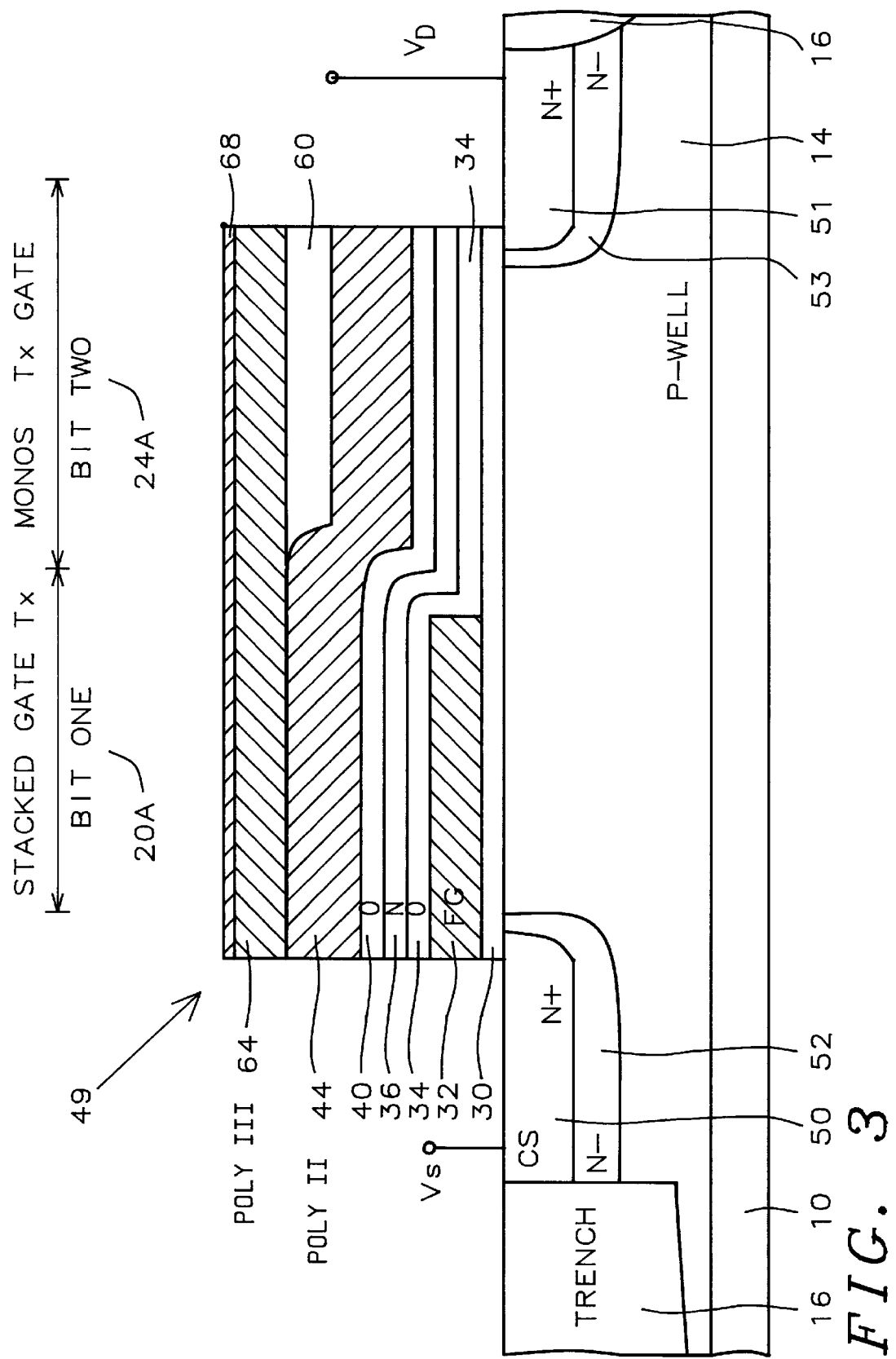
FIG. 3 is a cross sectional drawing of the multi-level memory cell of the present invention showing the details of the ONO layer (41) 34 36 40.

FIG. 3 shows the memory device with the ONO layer 41 shown as three separate layers 34 36 40.

The NOMOS transistor 24A gets it name from its structure where:

M—metal from control gate 44
O—oxide from second oxide layer 40
N—nitride from nitride layer 36
O—oxide from the first oxide 34 and the tunnel oxide layer 30
S—silicon from the silicon substrate 10

SUMMARY OF THE PROCESS FOR MAKING THE MULTI-LEVEL MONOS MEMORY DEVICE

The process of the present invention to form a multi-level memory device can be summarized as shown below:

1. FIGS. 1A and 1L providing a substrate having MONOS gate areas 24, adjacent poly floating gate areas 20, a Source/drain/trench areas 78 79 between the MONOS gate areas 20, and adjacent floating gate areas 24.

2. FIG. 1A—growing a tunnel oxide layer 30 having a thickness in a range of between about 60 and 100 Å.

3. depositing a poly I layer using an in-situ doped phosphorous with doping concentration 3E20 ions/cc having a thickness in a range of between about 2500 and 3500 Å.

4. patterning the first polysilicon layer (poly I) layer forming a first polysilicon layer 32 which will function as a (double width) poly floating gate electrodes 32. See FIG. 1A.

5. forming an ONO (oxide/nitride/oxide) layer 41 (34 36 40) over the substrate and the floating gate electrode 32. The ONO layer is formed by:

a) Growing a high temperature oxide layer 34 thickness in a range of between about 60 and 80 Å;

b) depositing nitride layer 36 thickness in a range of between about 60 and 100 Å; and c) depositing 60–80 Å high temperature oxide layer 38 .

6. FIG. 1B—depositing a second polysilicon (poly II) layer 44 thickness in a range of between about 6500 and 7500 Å (tgt 7000 Å). Poly II will function a a contol gate for both the poly flash transistor 20a and the MONOS transistor 24A.

7. growing a pad oxide layer thickness in a range of between about 450 and 550 Å (not shown in figures or shown as combined layer 42)

8. depositing a second nitride layer 42 having a thickness in a range of between about 100 and 300 Å

9. FIG. 1B—patterning the second nitride layer 42, the Second polysilicon (poly II) layer 44 and the ONO layer 41 over the Source area 78 and the drain area 79 thereby forming a control gate over the floating gate area 20 and the NOMOS gate area 24.

10. FIG. 1C forming a first Photoresist layer 43 having a first opening 43A over a source/drain/STI area 78 79 to pattern the first polysilicon layer (poly I) layer 32.

11. etching the ONO layer 41 and the First polysilicon layer (poly I) layer 32 using the first photoresist layer 43 as a mask forming floating gate electrodes 32 and defining a dual gate stack 49.

12. FIG. 1D—removing the first photoresist layer 43.

13. FIG. 1E—Depositing low temperature oxide layer having a thickness in a range of between about 1 and 3 µm and etching back the low temperature oxide layer to form spacers 47 on the sidewalls of the dual gate stack 14. FIG. 1F—etching the substrate using the spacers 47 as a etch mask forming a trench 71 (e.g., shallow trench isolation (STI) trench 71) having a depth in a range of between about 1 to 3 µm.

15. FIG. 1G—growing a pad oxide over the substrate. The pad oxide layer thickness in a range of between about 300 to 500 Å.

16. FIG. 1G—depositing blanket nitride layer over the substrate, over the second polysilicon (poly II) layer and in filling the trench 71; the having thickness in a range of between about 2 and 3 µm.

17. FIG. 1G—etching back the blanket nitride layer forming an isolation layer 70 filling the trench 71, and removing the blanket nitride and the second nitride layer 42 and pad ox layer remaining over the second polysilicon (poly II) layer.

18. FIG. 1H—removing the spacers 47.

19. FIGS. 1I and 2B—forming lightly doped n-source and drain regions 51 53 adjacent to the dual gate stack 49;

a) n-implant (P ions dose 5E13 to 5E14 ions/cc and energy 30–50 Kev).

20. FIGS. 1I and 2B—forming source and drain regions 50 52 adjacent to the dual gate stack 49;

a) source drain n+ implant (arsenic 5E15 cm-30–50 Kev)

b) source and drain regions extend in a first direction along the surface of the substrate; See FIG. 2A.

21. FIG. 1J—depositing an insulating (CVD oxide) layer 76 having a thickness in a range of between about 3 and 5 µm.

22. FIG. 1K—etching back the insulating layer 76 to expose the second polysilicon (poly II) layer and leaving a remaining insulating layer 76a over the source/drain/STI area;

23. FIG. 1L—depositing a third polysilicon (poly III) layer having thickness in a range of between about 2500 and 3500 Å;

24. doping the third polysilicon (poly III) layer using a n+ implant (arsenic 5E15 cm-2–50 Kev.

25. FIG. 1L—forming a (TiSi$_2$) silicide layer 68 over the third polysilicon layer 64.

26. see FIGS. 1L, 2A and 2B—patterning the Thrid polysilicon (poly III) layer 64 to form a wordline perpendicular to the source and drain regions.

27. FIG. 1L—etching the dual stacked gate 49 to remove the Second polysilicon (poly II) layer, ONO poly I—finish defining the stack gates as shown in FIG. 2A.

28. perform a p-field implant to isolate adjacent cells (boron 3E013 to 5E14 ions/cc)

29. forming metallization and back end processing to complete the multilevel split gate MONOS memory device.

ELECTRICAL CONFIGURATION OF MULTI-LEVEL LOGIC CELL

Figure 5A:
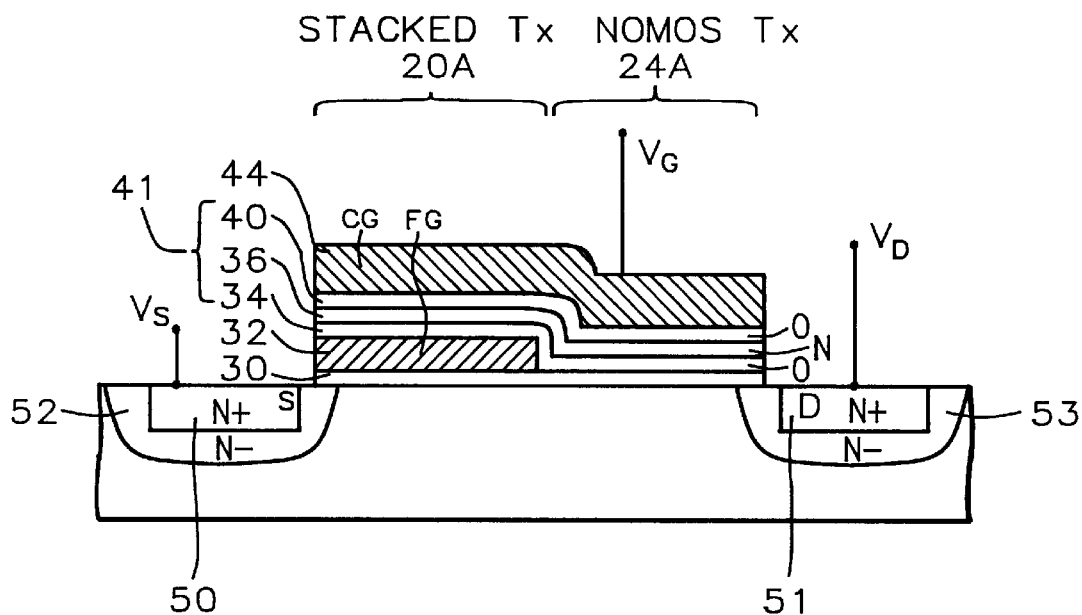
FIG. 5A shows a sectional view of the cell structure of a device in accordance with this invention.

FIG. 5A shows a sectional view of the cell structure of a device in accordance with this invention.

Figure 4A:
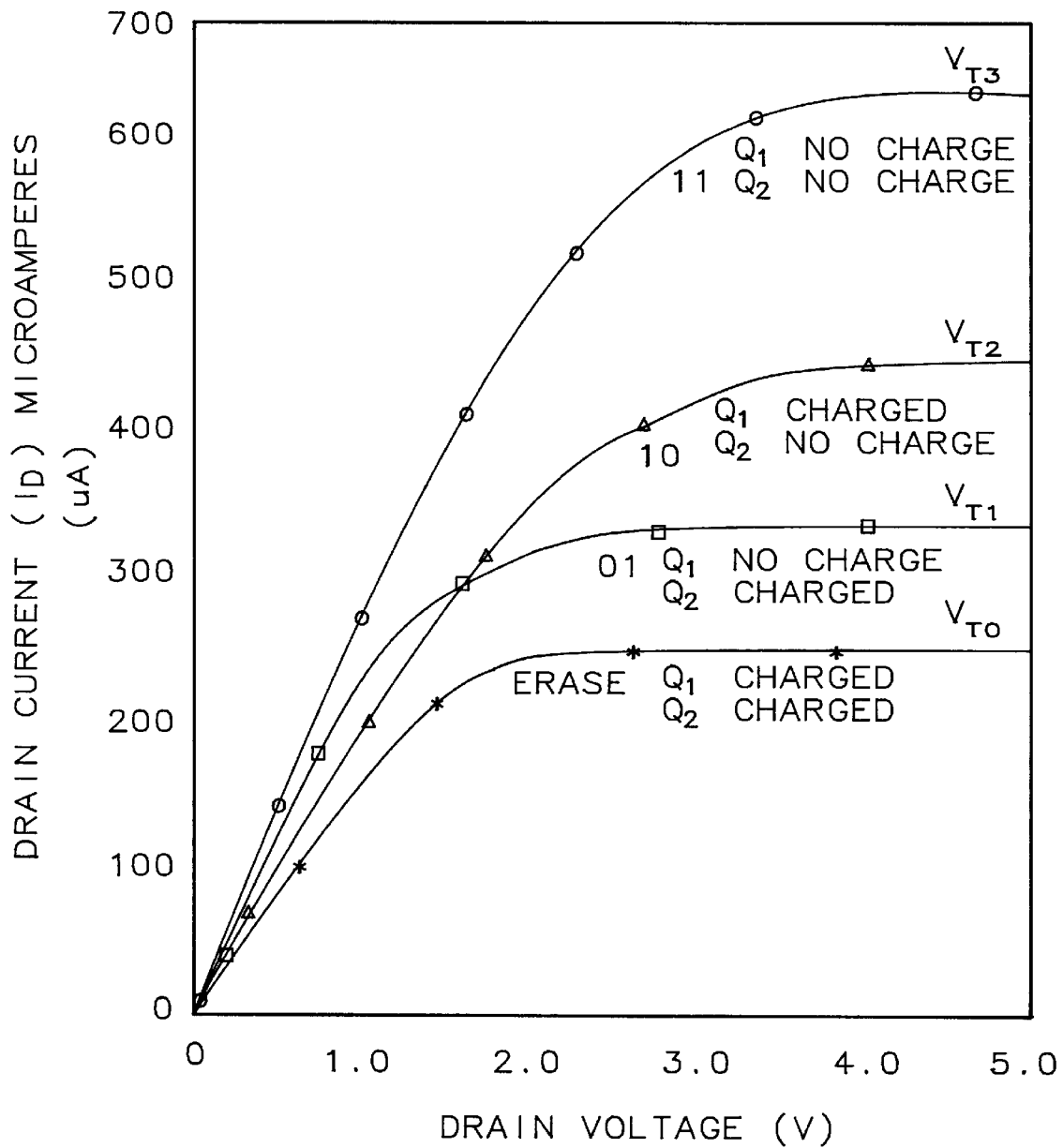
FIG. 4A shows the relationship between drain current (Id) and drain voltage for the 4 states of the memory device of the present invention.
Figure 4B:
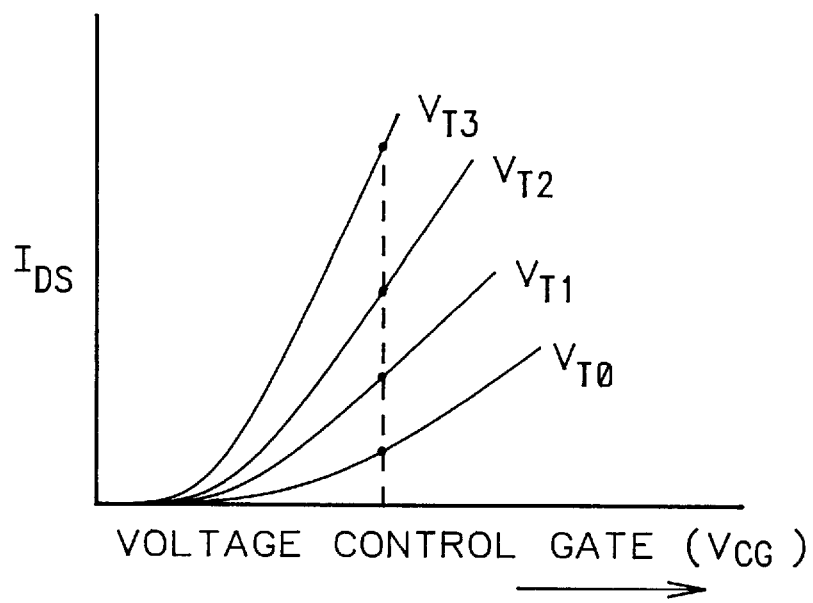
FIG. 4B shows the relationship between drain/source current (Ids) and control gate voltage for the 4 states of the memory device of the present invention.
Figure 5B:
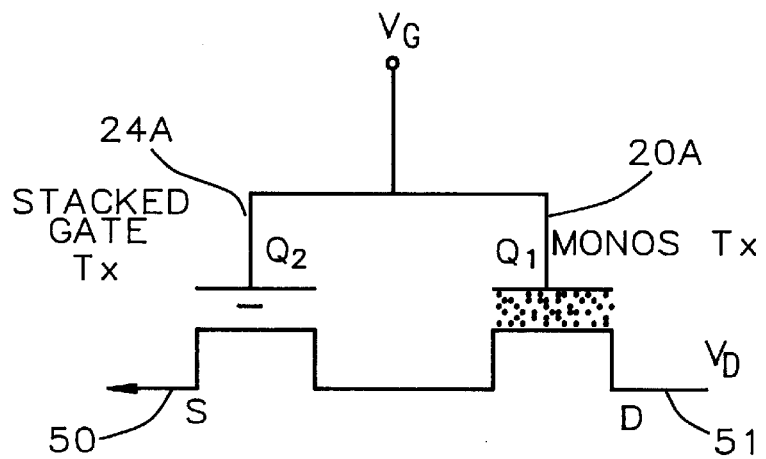
FIG. 5B shows an equivalent circuit of the memory device of FIG. 5A in accordance with the present invention.

FIG. 5B shows an equivalent circuit of the memory device of FIGS. 4 and 5A. Q1 is the charge on the MONOS transistor 24A. Q2 is the charge of the Stacked gate transistor (Tx) 20A.

Figure 5C:
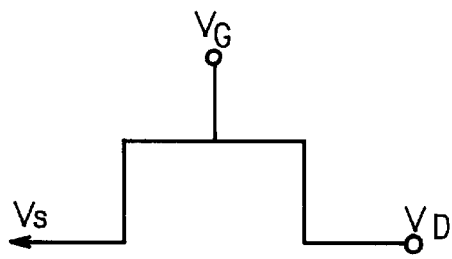
FIG. 5C shows another equivalent circuit of the memory device of FIG. 5A in accordance with the present invention.

FIG. 5C shows another equivalent circuit of the memory device of FIGS. 4 and 5A.

The device of FIGS. 5B and 5c include a p-substrate in which a N+ doped regions S/D are formed as the source and drain of a device in accordance with this invention. The source region S is connected to voltage Vs though a line to contact. The drain region D is connected to voltage Vd through a line to contact. Between the source/drain S/D regions is the channel 24 20 of the device. Above the S/D regions is the space for a tunnel oxide layer 30 (not shown for convenience of illustration) and thereabove is the floating gate electrode 32 and the N memory layer 36 of the MONOS transistor. The control gate electrode CG 44 is connected to voltage Vg through a line to contact.

MULTI-LEVEL LOGIC MEMORY CELL OPERATION

The program, erase, and read voltages employed through operating the cell of the flash memory device of FIGS. 4A, 4B, 5a, 5B and 5c are as follows:

The device wherein program, erase and read voltages employed for memory operation of the device are as follows:

|    | program Floating Gate | program MONOS | Erase | Read |
|----|-----------------------|---------------|-------|------|
| Vg | −4 V to −6 V | −4 V to −6 V | 15 to 20 V | 3 to 5 V |
| VD | Floating | 4 V to 6 V | 0 V | 1 to 2 V |
| VS | 8 to 10 V | Floating | 0 V | 0 V | whereby operation of the device is controlled.

The device wherein program, erase and read voltages employed for memory operation of the device are as follows: See FIGS. 4A, 4B, 5A, 5B and 5C.

| Vt | Logic States | Q1 | Q2 |
|----|-------------|----|----|
| Vt0 | erased | charged | charged |
| VT1 | 01 | charged | No Charge |
| Vt2 | 10 | No Charge | Charge |
| Vt3 | 11 | NO Charge | No Charge | where Q1 is the charge on the first nitride layer 41 overlying the MONOS channel 24 and the Q2 is the charge on the floating gate electrode 32 whereby operation of the device is controlled. Note that Vt1 and VT2 can be exchanged (i.e., alternately VT1 (Q2 no charge, q2 Charged) and Vt2 (Q1 charged-!2 no charge). Also, the terms "charge" and "no charge" are relative term where "charge" means more voltage that the "no charge" state. E.g., no charge can mean "less charge".

FIG. 4a shows the relationship between drain current (Id) and drain voltage for the 4 states of the memory device. FIG. 4A is a graph of silulated 4-level currents in the Multi-level flash cell at 27° C. The amount of charge injected/ejected in/from the floating gate/ONO can be designed. That is why Vt1 and Vt2 are exchangeable.

FIG. 4B shows the Vcg (Voltage of the Control gate) vs Ids (drain to source current) for the 4 logic states of the device of the invention.

DEVICE DESCRIPTION

Another aspect of the present invention is the device structure for the multi-level memory device having a stacked gate transistor in series with a MONOS transistor.

a) See FIG. 1L—a substrate 10 having a poly floating gate channel area 20, a MONOS channel area 24, and a source area 78 adjacent the floating gate channel area 20 and a drain area 78 adjacent the a MONOS channel area 24;

b) a tunnel oxide layer 30 over the floating gate channel area 20, the MONOS channel area 24 of the substrate 10;

c) a floating gate electrode 32 over the floating gate channel area 20;

d) an ONO layer 41 over the floating gate electrode 32 and the tunnel oxide layer 30 over the MONOS channel area 24;

e) a control gate electrode 44 over the ONO layer over the floating gate electrode 32 and the MONOS channel area 24;

f) shallow trench isolation regions 70 in portions of the source and drain area 78 79 in the substrate 10;

g) a source region 52 in the source area 79 the substrate adjacent to the stacked gate channel area 20 and under a portion of the floating gate electrode 32; and forming a drain region 50 51 in the drain area 78 in the substrate adjacent to the MONOS channel area 24 and under a portion of the ONO layer 41; the source and drain regions 50 51 52 53 orientated in a first direction;

h) an insulating layer 60 over the control gate electrode over the MONOS channel area 24;

i) a word line 64 68 over the control gate electrode 44 and the insulating layer 60; the word line oriented in a second direction perpendicular to the source and drain regions 50 51 52 53;

j) the control gate electrode 44 and the floating gate electrode 32 forming a floating gate transistor over the floating gate channel area 20; and the ONO layer and the control gate over the MONOS channel area 24 forming a MONOS transistor over the MONOS channel area 24; and the floating gate transistor 20A.

SUMMARY OF FEATURES OF THE INVENTION

The invention provides a memory device with the following features.

1. The device is a MONOS split gate flash memory cell for multi-level logic (e.g., 4 logic states ($V_{t0}$ to $V_{t4}$)

2. The device provides a MONOS transistor 20A in series with a polysilicon stacked gate flash transistor 24A for multi-level memory storage.

3. The device has a new operation using Fowler-Nordheim in both the MONOS transistor and the stacked gate (FN/FN) to achieve multi-level memory storage.

4. The device has a split-gate structure used for a single bit multi-level storage Flash Memory cell.

5. The device allows a higher density flash memory using the same process technology.

6. Four levels of logic are produced by varying the charge of the stacked gate and the MONOS gate.

7. The memory device is erased by charging the control gate and without using a separate erase gate.

Figure 2C:
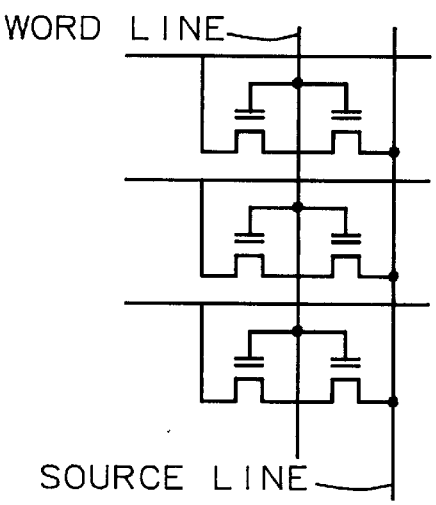
FIG. 2C shows an electrical schematic representation of the memory device of the present invention.

The multi-level MONOS device of the invention is different than the prior art device in Nozaki IEEE article titled "*A 1-Mb EEPROM With A MONOS Memory Cell For A Semiconductor Disk Application*" IEEE Journal of Solid State circuits, Vol. 26, No 4, April (1991) p. 498.). Nozaki forms a convention bi-level memory device, not a multi-level device. Also Nozaki does not have a floating gate. Instead, it used the MOS transistor as a select transistor. In cell of the invention uses a divided floating gate island as shown in FIGS. 2B, 2C and 5A.

While the invention has been particularly shown and described with reference to the preferred embodiments thereof, it will be understood by those skilled in the art that various changes in form and details may be made without departing from the spirit and scope of the invention.

What is claimed is:

1. A method of manufacture of a multi-level logic flash memory cell comprising the steps as follows:
   a) forming a tunnel oxide layer on a surface of a substrate having active regions; said substrate having a floating gate channel area and a MONOS channel area in said active regions;
   b) forming a poly floating gate electrode over said stacked gate channel region;
   c) forming an ONO layer over said poly floating gate electrode and the exposed surfaces of said tunnel oxide layer;
   d) forming a second polysilicon layer over said ONO layer;
   e) forming a pad oxide layer over said second polysilicon layer;
   f) forming a second nitride layer over said pad oxide layer;
   g) patterning said second nitride layer, said pad oxide layer, said second polysilicon layer, and said ONO layer forming a dual gate stack; the remaining portion of said second polysilicon layer forming a control gate electrode spanning across said poly floating gate electrode and said ONO layer over said MONOS channel region;
   h) forming shallow trench isolation regions in said substrate surrounding said dual gate stack;
   i) forming a source region in said substrate adjacent to said floating gate channel area and under a portion of said poly floating gate electrode; and forming a drain region in said substrate adjacent to said MONOS channel area and under a portion of said ONO layer; said source and drain regions orientated in a first direction;
   j) said control gate electrode and said floating gate electrode forming a poly floating gate transistor over said floating gate channel area; and said ONO layer and said control gate over said MONOS channel area forming a MONOS transistor over said MONOS channel area; a multi-level logic flash memory cell comprised of said poly floating gate transistor and said MONOS transistor.

2. The method of claim 1 which further includes
   a) removing said second nitride layer and said pad oxide layer over said second polysilicon layer;
   b) forming an insulating layer over said second polysilicon layer over said MONOS channel area.
   c) forming word lines connected to and over said second polysilicon layer and over said insulating layer; said word lines perpendicular to said source and drain regions.

3. The method of claim 1 wherein said ONO layer formed by:
   a) forming a first oxide layer over said floating gate electrode and over said tunnel oxide layer; said first oxide layer composed of a high temperature oxide with a thickness in a range of between about 60 and 80 Å;
   b) forming a first nitride layer over the first oxide layer; said first nitride layer has a thickness in a range of between about 60 and 80 Å;
   c) forming a second oxide layer over said first nitride layer; said second oxide layer has a thickness in a range of between about 60 and 80 Å.

4. The method of claim 1 wherein second nitride layer has a thickness in a range of between about 1000 and 3000 Å.

5. The method of claim 1 wherein said multi-level logic flash memory cell is programmed, erased and read as follows:

|  | program Floating Gate | program MONOS | Erase | Read |
| --- | --- | --- | --- | --- |
| Vg | −4 V to −6 V | −4 V to −6 V | 15 to 20 V | 3 to 5 V |
| VD | Floating | 4 V to 6 V | 0 V | 1 to 2 V |
| VS | 8 to 10 V | Floating | 0 V | 0 V | whereby operation of said multi-level logic flash memory cell is controlled.

6. The method of claim 1 wherein said multi-level logic flash memory cell is programmed, erased and read using a Vt as follows:

| Vt | Logic States | Q1 | Q2 |
| --- | --- | --- | --- |
| Vt0 | erased | charged | charged |
| VT1 | 01 | charged | No Charge |
| Vt2 | 10 | No Charge | Charge |
| Vt3 | 11 | NO Charge | No Charge | whereby operation of said multi-level logic flash memory cell is controlled.

7. A method of manufacture of a multi-level logic flash memory cell comprises the steps as follows:
   a) forming a tunnel oxide layer on a surface of a substrate; said substrate having a floating gate channel area and a MONOS channel area;
   b) forming a floating gate electrode over said stacked gate channel region;
   c) forming an ONO layer over the top of said floating gate electrode and covering the sidewalls thereof and the exposed surfaces of said tunnel oxide layer;
   d) forming a second polysilicon layer over said second oxide layer;

e) forming a pad oxide layer over said second polysilicon layer;

f) forming a second nitride layer over said pad oxide layer;

g) patterning said second nitride layer, said pad oxide layer, said second polysilicon layer, said ONO layer forming a dual gate stack; the remaining portion of said second polysilicon layer forming a control gate electrode spanning across said floating gate electrode and said MONOS channel region;

h) forming shallow trench isolation regions in said substrate;

i) forming a source region in said substrate adjacent to said stacked gate channel area and under a portion of said floating gate electrode; and forming a drain region in said substrate adjacent to said MONOS channel area and under a portion of said ONO layer; said source and drain regions orientated in a first direction;

j) forming polysilicon word lines perpendicular to said source and drain regions;

k) said control gate electrode and said floating gate electrode forming a floating gate transistor over said floating gate channel area; and said ONO layer and said control gate over said MONOS channel area forming a MONOS transistor over said MONOS channel area.

8. The method of claim 7 wherein said ONO layer formed by:

a) forming a first oxide layer the top of said floating gate electrode and covering the sidewalls thereof and the exposed surfaces of said tunnel oxide layer;

b) high temperature oxide thickness in a range of between about 60 and 80 Å;

c) forming a first nitride layer over the first oxide layer; said first nitride layer having a thickness in a range of between about 60 and 80 Å; and d) forming a second oxide layer over said first nitride layer; said second oxide layer having a thickness in a range of between about 60 and 80 Å.

9. The method of claim 7 wherein second nitride layer has a thickness in a range of between about 1000 and 3000 Å.

10. The method of claim 7 wherein said multi-level logic flash memory cell is programmed, erased and read as follows:

|    | program Floating Gate | program MONOS | Erase | Read |
|----|----|----|----|----|
| Vg | −4 V to −6 V | −4 V to −6 V | 15 to 20 V | 3 to 5 V |
| VD | Floating | 4 V to 6 V | 0 V | 1 to 2 V |
| VS | 8 to 10 V | Floating | 0 V | 0 V | whereby operation of said device is controlled.

11. The method of claim 7 wherein said multi-level logic flash memory cell is programmed, erased and read using a Vt as follows:

| Vt | Logic States | Q1 | Q2 |
|----|----|----|----|
| Vt0 | erased | charged | charged |
| VT1 | 01 | charged | No Charge |
| Vt2 | 10 | No Charge | Charge |
| Vt3 | 11 | NO Charge | No Charge | whereby operation of said multi-level logic flash memory cell is controlled.

* * * * *